United States Patent
Prasad et al.

(10) Patent No.: US 12,512,347 B2
(45) Date of Patent: Dec. 30, 2025

(54) METHODS AND APPARATUS FOR WAFER DETECTION

(71) Applicant: Applied Materials, Inc., Santa Clara, CA (US)

(72) Inventors: Bhaskar Prasad, Adityapur (IN); Thomas Brezoczky, Los Gatos, CA (US); Kirankumar Neelasandra Savandaiah, Bangalore (IN); Anubhav Srivastava, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 949 days.

(21) Appl. No.: 17/143,712

(22) Filed: Jan. 7, 2021

(65) Prior Publication Data

US 2022/0216079 A1  Jul. 7, 2022

(51) Int. Cl.
*H01L 21/67* (2006.01)
*H01L 21/683* (2006.01)

(52) U.S. Cl.
CPC .... *H01L 21/67259* (2013.01); *H01L 21/6833* (2013.01)

(58) Field of Classification Search
CPC ........... H01L 21/67259; H01L 21/6833; H01L 21/67288; H01L 21/68742
See application file for complete search history.

(56) References Cited

U.S. PATENT DOCUMENTS 5,226,523 A * 7/1993 Kawakami ........... G05B 19/231
                                                198/341.02
5,684,669 A * 11/1997 Collins .................. H02N 13/00
                                                361/234

(Continued)

FOREIGN PATENT DOCUMENTS

JP   H11-260897 A   9/1999
JP   2004-228488 A  8/2004

(Continued)

OTHER PUBLICATIONS

"Current, power and torque in variable speed drives." Nidec.com, Aug. 14, 2017, https://acim.nidec.com/en-us/drives/control-techniques/news-and-media/blog/technical/current-power-and-torque-in-variable-speed-drives#:~:text=Motor%20current,current%20which%20links%20the%20flux. (Year: 2017).*

(Continued)

*Primary Examiner* — Robert E Fennema
(74) *Attorney, Agent, or Firm* — Patterson + Sheridan, LLP

(57) ABSTRACT

Embodiments described herein relate to methods and apparatus for detecting and/or monitoring, e.g., abnormalities in wafer transfer and handling. In an embodiment, a method for wafer dechucking verification is provided. The method includes initiating a wafer transfer operation to transfer a wafer between components of a semiconductor processing system, the semiconductor processing system comprising a motor coupled to a lift pin, the motor configured to adjust a height of the lift pin above a pedestal, the lift pin for raising or lowering the wafer. The method further includes measuring one or more first parameters during the wafer transfer operation, comparing the one or more first parameters to one or more first pre-determined parameter ranges, and changing a force applied to the lift pin based on the one or more first parameters. Apparatus for wafer dechucking verification and non-transitory computer-readable mediums storing instructions for wafer dechucking verification are also provided

8 Claims, 6 Drawing Sheets

(56) References Cited

U.S. PATENT DOCUMENTS

| | | | |
|---|---|---|---|
| 5,773,953 A * | 6/1998 | Ukaji | G03F 7/70691 318/687 |
| 6,646,857 B2 * | 11/2003 | Anderson | H01L 21/68742 361/160 |
| 6,796,795 B2 * | 9/2004 | Inaba | C23C 14/564 219/390 |
| 7,292,428 B2 * | 11/2007 | Hanawa | H01L 21/6831 361/234 |
| 8,363,378 B2 * | 1/2013 | Bluck | H01L 21/68742 361/234 |
| 8,797,705 B2 * | 8/2014 | Valcore, Jr. | H01L 21/6831 361/234 |
| 8,832,916 B2 | 9/2014 | Povolny | |
| 9,054,142 B2 * | 6/2015 | Zhen | G05B 19/41835 |
| 9,108,322 B2 * | 8/2015 | Chisholm | H01L 21/68742 |
| 9,401,299 B2 * | 7/2016 | Sowden | H01L 21/68 |
| 11,114,326 B2 * | 9/2021 | Boyd, Jr. | H01J 37/32449 |
| 11,798,833 B2 * | 10/2023 | Wirth | F15B 9/03 |
| 11,830,760 B2 * | 11/2023 | Wirth | H01J 37/32733 |
| 12,020,968 B2 * | 6/2024 | Kawawa | C23C 14/50 |
| 2002/0141133 A1 | 10/2002 | Anderson et al. | |
| 2006/0238953 A1 | 10/2006 | Hanawa et al. | |
| 2010/0013626 A1 | 1/2010 | Park et al. | |
| 2010/0208409 A1 | 8/2010 | Bluck et al. | |
| 2010/0218895 A1 | 9/2010 | Tezuka et al. | |
| 2011/0060442 A1 * | 3/2011 | Valcore, Jr. | H01L 21/67253 700/103 |
| 2013/0015598 A1 * | 1/2013 | Kimura | B82Y 10/00 425/150 |
| 2014/0324221 A1 | 10/2014 | Chisholm et al. | |
| 2020/0075389 A1 | 3/2020 | Tian et al. | |
| 2020/0249263 A1 | 8/2020 | Xu et al. | |
| 2021/0011468 A1 * | 1/2021 | Terasawa | G05B 19/4184 |
| 2022/0122878 A1 * | 4/2022 | Wu | H01L 21/68714 |
| 2024/0105494 A1 * | 3/2024 | Li | H01L 21/67259 |

FOREIGN PATENT DOCUMENTS

| | | | | |
|---|---|---|---|---|
| JP | 2004-531883 A | | 10/2004 | |
| JP | 2006-303138 A | | 11/2006 | |
| JP | 2007-505500 A | | 3/2007 | |
| JP | 2007-258299 A | | 10/2007 | |
| JP | 2008-177464 A | | 7/2008 | |
| JP | 2008-539598 A | | 11/2008 | |
| JP | 2008277706 A | * | 11/2008 | H01L 21/683 |
| JP | 2010212678 A | | 9/2010 | |
| JP | 2019149510 A | * | 9/2019 | H01L 21/683 |
| KR | 20100094416 A | | 8/2010 | |
| KR | 20160003144 A | | 1/2016 | |
| KR | 20170024215 A | | 3/2017 | |
| TW | 201308512 A | | 2/2013 | |
| WO | 2006116577 A2 | | 11/2006 | |
| WO | 2009/144938 A1 | | 12/2009 | |

OTHER PUBLICATIONS

Hollings, Gabriel, "Strain Gauges: How They Work, Applications, and Types," EndaqBlog, Dec. 4, 2020, https://blog.endaq.com/strain-gauges-how-they-work-applications-and-types, accessed Jun. 13, 2024.*

"Strain Gauge Applications," MinebeaMitsumi, nmbtc.com, Oct. 28, 2020, https://nmbtc.com/custom-products/strain-gauge/, accessed Jun. 13, 2024.*

"Strain Gauge Technology in Field Testing," sensing-systems.com, Jun. 24, 2018, http://www.sensing-systems.com/blog/strain-gauge-technology-in-field-testing, accessed Jun. 13, 2024.*

"Torque Sensors & Torque Transducers," Applied Measurements, appmeas.co.uk, Oct. 25, 2020, https://appmeas.co.uk/products/torque-sensors/, accessed Jun. 13, 2024.*

"Strain Gauges," Omega, Sep. 15, 2020, https://www.omega.com/en-us/resources/strain-gages/#:~:text=A%20Strain%20gauge%20is%20a,and%20strain%20are%20the%20result, accessed Oct. 9, 2024.*

"Load Cells vs. Strain Gauges: Exploring the Differences and Benefits," MeasureX, Nov. 15, 2023, https://www.measurex.com.au/load-cells-vs-strain-gauges/#:~:text=Understanding%20the%20Differences%3A,caused%20by%20the%20applied%20force, accessed Oct. 9, 2024.*

JP-2008277706-A translation (Year: 2008).*

JP-2019149510-A translation (Year: 2019).*

International Search Report and Written Opinion dated Mar. 15, 2022 for Application No. PCT/US2021/060096.

Japanese Office Action dated Sep. 10, 2024 for Application No. 2023-540695.

Korean Office Action dated Sep. 5, 2024 for Application No. 10-2023-7026406.

Taiwan Office Action dated Jul. 11, 2025 for Application No. 111100754.

Japanese Office Action dated Mar. 18, 2025 for Application No. 2023-540695.

Korean Office Action dated May 12, 22, 2025 for Application No. 10-2023-7026406.

* cited by examiner

METHODS AND APPARATUS FOR WAFER DETECTION

BACKGROUND

Field

Embodiments of the present disclosure generally relate to substrate processing, and more specifically to methods and apparatus for detecting and/or monitoring, e.g., abnormalities in wafer transfer and handling.

Description of the Related Art

Wafers can break/bow easily during handling and transfer, particularly when utilizing electrostatic chucks. Electrostatic chucks utilize a platen with integral electrodes which are biased with high voltage to establish an electrostatic holding force between the platen and wafer. The residual charges on the wafer and pedestal dissipate slowly, causing wafer breakage and partial chucking. In addition, wafer breakage occurs when the lift pins are moved before dissipation of the residual charge. As a result, wafer throughput is diminished. Conventional methods of wafer detection within semiconductor fabs typically utilize sensors to monitor the wafer during handling and transfer. However, such sensors are costly, and wafer breakage still presents a challenge even when utilizing the sensors.

There is a need for new and improved methods of detecting and/or monitoring, e.g., abnormalities during wafer transfer and handling that overcome one or more deficiencies in the art.

SUMMARY

Embodiments of the present disclosure relate to methods and apparatus for detecting and/or monitoring, e.g., abnormalities in wafer transfer and handling.

In an embodiment, an apparatus for wafer dechucking verification is provided. The apparatus includes a motor coupled to a lift pin, the motor configured to adjust a height of the lift pin above a pedestal, the lift pin for raising or lowering a wafer. The apparatus further includes at least one processor, the at least one processor being configured to control the motor, initiate a wafer transfer operation to transfer the wafer between components of a semiconductor processing system using the motor and the lift pin, measure a parameter during the wafer transfer operation, and change a force applied to the lift pin based on the measured parameter.

In another embodiment, a method for wafer dechucking verification is provided. The method includes initiating a wafer transfer operation to transfer a wafer between components of a semiconductor processing system, the semiconductor processing system comprising a motor coupled to a lift pin, the motor configured to adjust a height of the lift pin above a pedestal, the lift pin for raising or lowering the wafer. The method further includes measuring one or more first parameters during the wafer transfer operation, comparing the one or more first parameters to one or more first pre-determined parameter ranges, and changing a force applied to the lift pin based on the one or more first parameters.

In another embodiment, a non-transitory computer-readable medium storing instructions that, when executed on a processor, perform operations for wafer dechucking verification is provided. The operations include initiating a wafer transfer operation to transfer a wafer between components of a semiconductor processing system, the semiconductor processing system comprising a motor coupled to a lift pin, the motor configured to adjust a height of the lift pin above a pedestal, the lift pin for raising or lowering the wafer. The operations further include one or more of measuring a first current powering the motor during the wafer transfer operation and determining a difference between the first current and a first pre-determined current range, or measuring a first torque for raising or lowering the wafer during the wafer transfer operation and determining a difference between the first torque and a first pre-determined torque range. The operations further include changing a force applied to the lift pin based on the first current, first torque, or both.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to methods and apparatus for detecting and/or monitoring, e.g., abnormalities in wafer transfer and handling. Briefly, the method includes monitoring/measuring a current of a motor in order to determine torque, and the torque determines the lift force used to lift a wafer. This method can be utilized to detect imperfect wafer handoff (or wafer transfer) due to, e.g., residual chucking, extra load applied on the wafer by the lift pin drive, among other abnormalities. Because abnormalities in, e.g., wafer transfer, lift pin position, and/or wafer position are detected, wafer transfer processes and/or other processes can be ceased prior to wafer damage, enabling closed-loop control.

Apparatus and methods described herein aid with, e.g., the ascertainment of whether the wafer has fully dechucked from the substrate support. In some embodiments, the apparatus and methods described herein can be used for, e.g., wafer dechucking verification and/or detecting a wafer dechucking status.

Example Apparatus

Figure 1A:
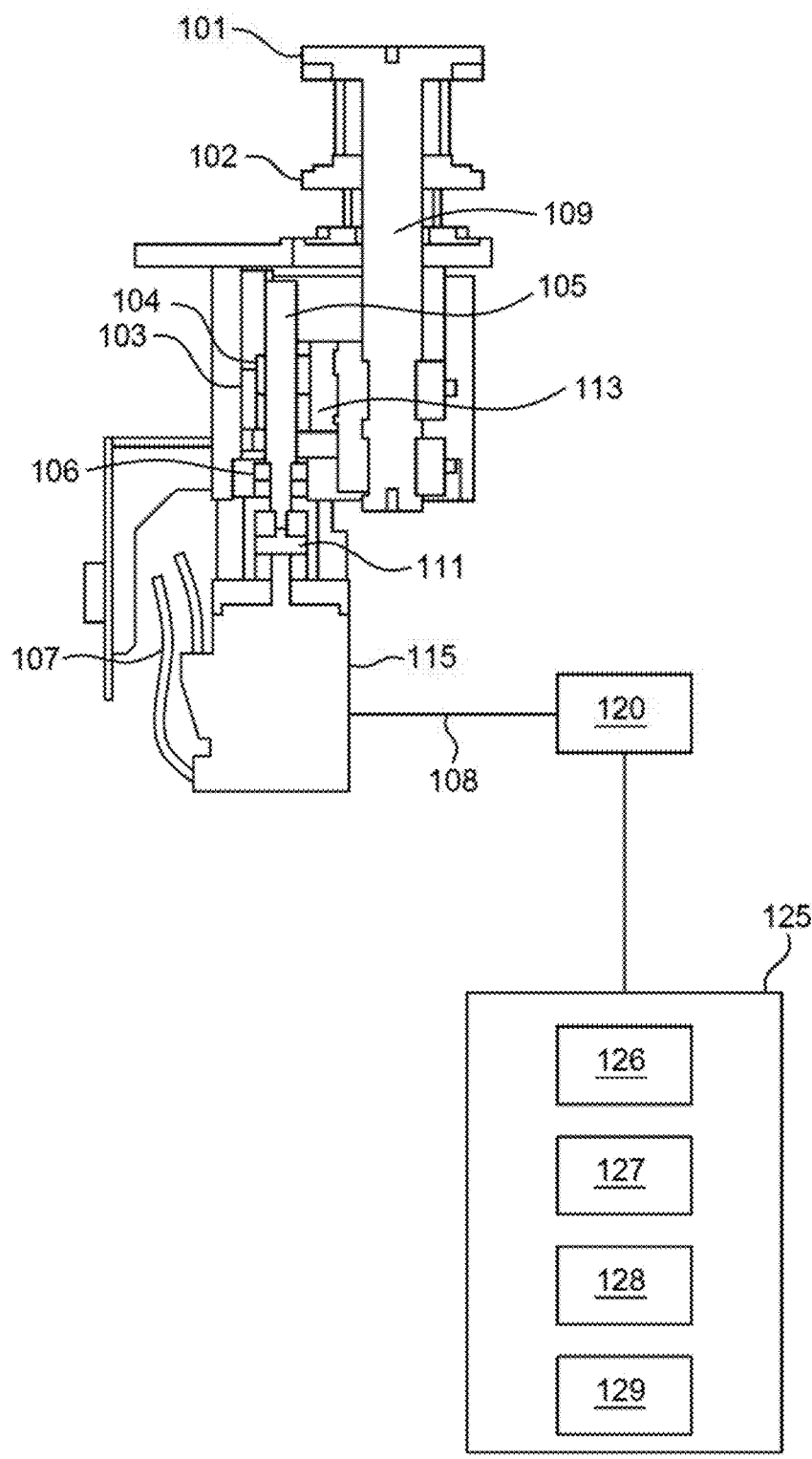
FIGS. 1A-1B shows components of an example apparatus for wafer detection according to at least one embodiment of the present disclosure.
Figure 1B:
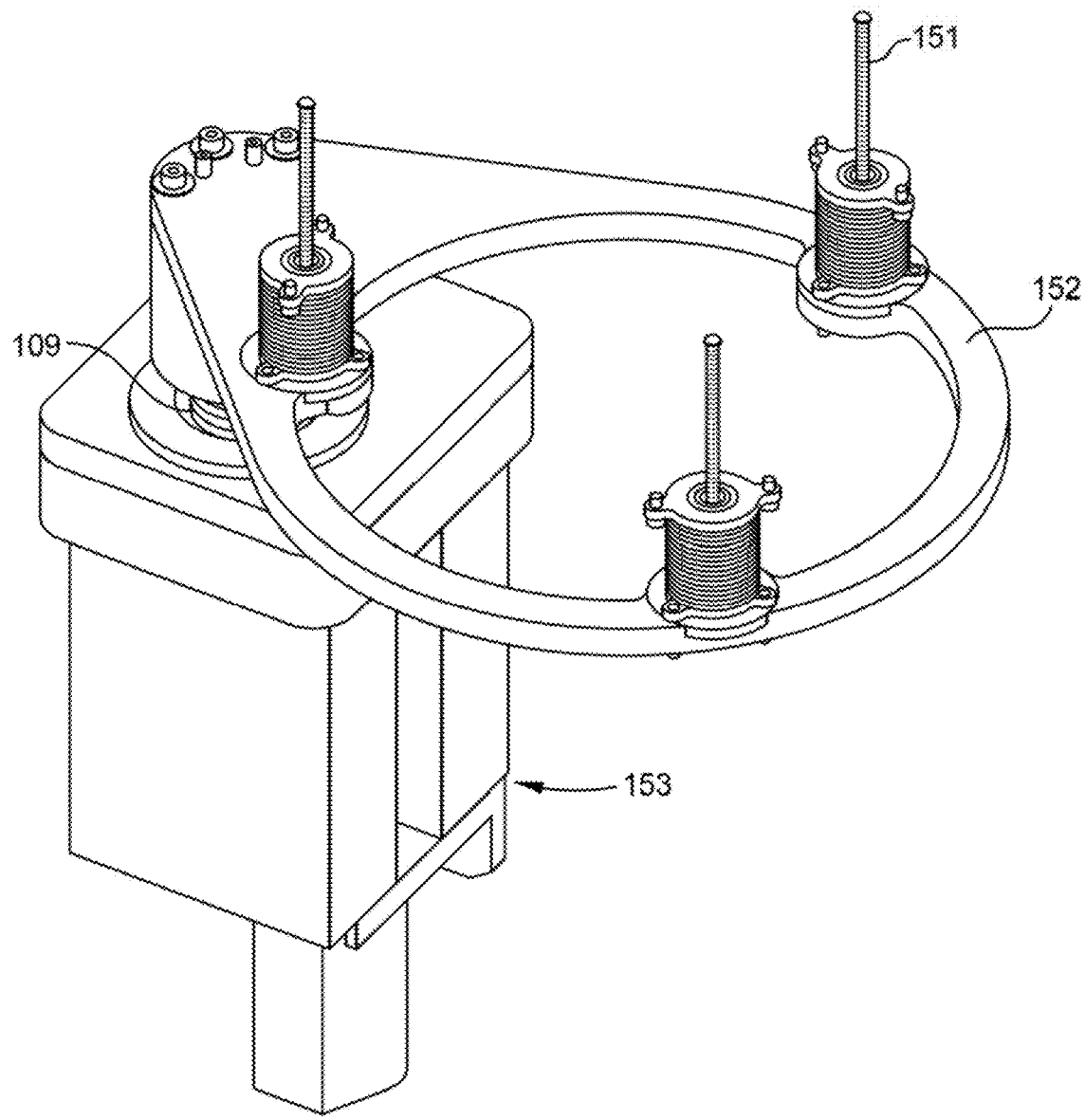

FIG. 1A is a side view of an apparatus utilized for wafer detection and for detecting the above mentioned abnormalities. The apparatus includes a lead screw shaft 105 coupled to a motor 115 via shaft coupling 111. The lead screw shaft 105 can be a lead screw shaft and a nut 104. Additionally, or alternatively, the lead screw shaft 105 and nut 104 can be a ball screw shaft and ball nut. Bearing 114 supports the lead screw shaft 105. A lifting shaft 109, which extends into a chamber during operation, is coupled to the nut 104 by a carrier block 113. The lifting shaft 109 extends through a chamber mount 102 and attached to a hoop mount 101 positioned in a chamber. A linear motion rail 103 serves as a guide surface for the nut 104. As shown in FIG. 1B, a hoop ring 152 is coupled to the hoop mount 101, and lift pins 151 for raising and lowering a substrate are coupled to the hoop ring 152. The drive assembly 153, which includes the lead screw shaft 105 and nut 104, bearing 114, and other components, is coupled to the hoop ring 152 and the lift pins 151. The motor 115 is connected to a power source (not shown) through a power cable 107. The motor 115 is also connected to other components of the system such as the programmable logic controller (PLC) 125, discussed below, by a communication cable 108.

In operation, the current driving the motor 115 can also be monitored and measured, and this current is related to the torque used to lift or lower the load by equation (1):

$$I_a = T/K_T \quad (1)$$

where $I_a$ is the armature current of the motor 115 (units of amperes (amp)), and $K_T$ is the motor torque constant (units of N·m/amp). An armature is a component of an electric machine which carries alternating current. As the load on the motor 115 increases, the motor 115 draws more current from a motor driver 120. The motor driver 120 is coupled to the motor 115 to enable control of the motor 115. The motor driver 120 is also coupled to the PLC 125. The PLC 125 controls various components of the motor driver 120.

The motor driver 120 (e.g., a drive motor control unit) detects the increased/decreased torque and/or the increased/decreased current when there is, e.g., partial chucking and/or the wafer is, e.g., lifted, handed-off, et cetera. The motor driver 120 includes a CPU that controls/monitors the motor 115. The changes in torque (and/or current) are communicated from the motor driver 120 to the PLC 125. Detection and response time using, e.g., ether-CAT and ether-net drivers can be in microseconds. Such response time is improved over traditional sensors.

As stated above, the PLC 125 controls the motor driver 120, and the motor driver 120 controls the power to drive the motor(s) 115 during, e.g., lifting, moving, and/or transferring of the wafer. The PLC 125 is a "master" driver (e.g., the "controller device"), while other drivers, e.g., the motor driver 120, are "slave" driver(s) (e.g., the "controlled device (s)"). The PLC 125 includes a controller 126. The controller 126 includes a central processing unit (CPU) 127, a memory 128, and support circuits 129 for the CPU 127. The controller 126 may be any suitable type of general-purpose computer processor that can be used in an industrial setting for controlling various chambers and sub-processors. The memory 128, or other computer-readable medium, for the CPU 127 may be one or more of any readily available memory forms, such as random access memory (RAM), read only memory (ROM), a floppy disk, a hard disk, or any other form of digital storage, local or remote. The support circuits 129 may be coupled to the CPU 127 in an effort to support the processor in a conventional manner. These circuits may include cache, power supplies, clock circuits, input/output (I/O) circuitry and subsystems, and the like. In some embodiments, the techniques disclosed herein for a deposition process as well as a cleaning regime may be stored in the memory as a software routine. The software routine may also be stored and/or executed by a second CPU (not shown) that is remotely located from the hardware being controlled by the CPU.

In some embodiments, a software algorithm with a predefined range for a current value (and/or torque value) at a defined position with wafer resting on the pedestal can trigger shut-off of the motor through the (PLC)-to-motor driver circuitry. According to at least one embodiment, one or more operations of the apparatus and methods described herein can be included as instructions in a computer-readable medium for execution by the controller unit (e.g., controller 126) or any other processing system.

As stated above, the motor driver 120, which is controlled by the PLC 125, is utilized to detect the current. This current, a sample current ($I_S$) can then be converted into torque using equation (1). The torque (sample torque, $T_S$) is then compared to benchmark operation data for torque (normal torque, $T_N$). The normal torque, $T_N$, is the amount of torque for normal operation with a suitable sample size of normal wafer exchange. The $T_N$ can be in the form of a range of values. Additionally, or alternatively, the sample current ($I_S$) can be compared to a benchmark current (e.g., a normal current, $I_N$). The $I_N$ can be in the form of a range of values.

In some embodiments, force on the lift pins can be changed in accordance with a sensor signal from e.g., a motor drive unit, pressure sensors embedded between the wafer and the electrostatic chuck, and/or the chucking current drawn by the electrostatic chuck. Each of the motor drive unit, pressure sensor(s), and chucking current can include a processor which can relay information to the PLC 125 in order to, e.g., control the motor.

Figure 2B:
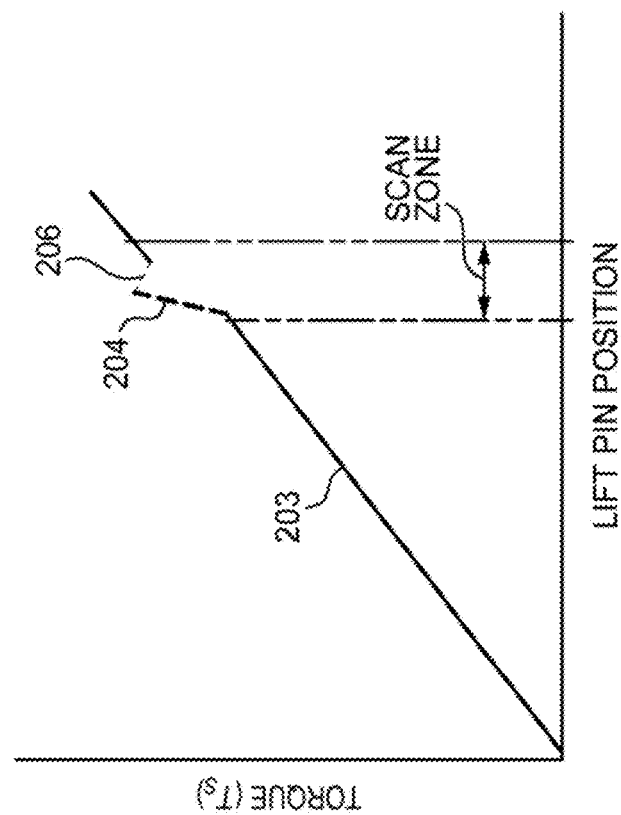
FIG. 2B is an exemplary graph of sample wafer pick-up data according to at least one embodiment of the present disclosure.
Figure 2A:
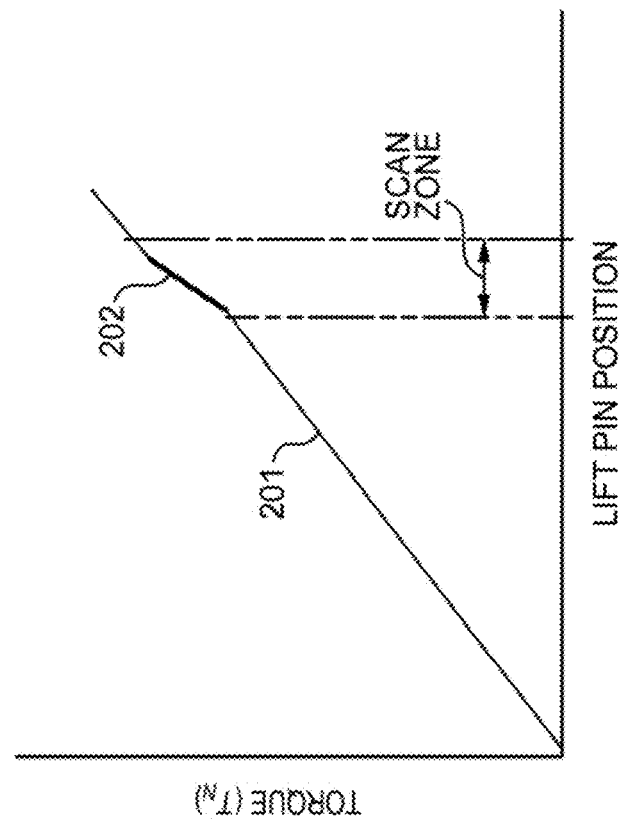
FIG. 2A is an exemplary graph for normal, or benchmark, wafer pick-up data according to at least one embodiment of the present disclosure.

FIG. 2A is an exemplary graph for normal, or benchmark, wafer pick-up data, where torque ($T_N$) is plotted as a function of wafer lift pin position. FIG. 2B is an exemplary graph of sample wafer pick-up data, where torque ($T_S$) is plotted as a function of lift pin position.

By comparing the slope of the sample wafer pick-up data versus the slope of the benchmark wafer pick-up data, the status of the wafer transfer can be determined. FIGS. 2A and 2B could be plotted as current versus position by using the equation (1). For simplicity, only the plots of torque versus lift pin position are shown.

The slope of the line 201 (FIG. 2A) shows a progressive increase in torque, where a "normal" torque (or current) slope is observed over a selected scan zone. In this case, a linear progressive increase in torque (or current) indicates, e.g., normal operation. The sample wafer pick-up data (FIG. 2B) of line 203 illustrates, e.g., abnormal wafer pick-up, abnormal wafer transfer, wafer breakage, and/or abrupt release of the wafer. Specifically, the spike in torque (or current)—shown as line 204—indicates, e.g., increased force, while the decline in slope of torque (or current)—shown as line 206—indicates, e.g., wafer breakage, abrupt release of wafer from the pedestal, and/or abnormal wafer transfer. Additionally, or alternatively, the sample current can be compared to the current of the benchmark operation data. As such, the plots can be current versus lift pin position.

Referring back to equation (1), output torque is directly proportional to armature current. Accordingly, the rate of armature current, $I_a$, with respect to position (x) or time (t) is also directly proportional to the rate of torque (T) with respect to position (x) or time (t), as given by equations (2) and (3), respectively:

$$dI_a/dx = dT/dx \qquad (2)$$

$$dI_a/dt = dT/dt \qquad (3)$$

Here, detection of an additional load due to abnormal wafer pick-up is found when the slope for the rate of armature current spike is above a threshold slope (e.g., normal operation). Wafer breakage and/or abnormal wafer release from the pedestal is found when the slope begins to reach a negative slope.

Example Transfer and Detection Sequence

Embodiments described herein are useful for monitoring and detecting wafer handoff. Wafer handoff, can occur between various hardware components of semiconductor processing systems. For example, wafer handoff can occur between the lift pins and a robot (e.g., a blade of the robot), between the pedestal and the lift pins, and between the lift pins and an indexer (e.g., a blade of the indexer). An illustrative, but non-limiting, wafer transfer sequence for indexer-based architectures is as follows:

(1) First, the wafer, held by a robot blade, enters the chamber through a slot in the chamber. (2) The lift pins 151 are raised via the motor and drive assembly 153, lifting shaft 174, and hoop ring 152 and pick up the wafer from the robot blade, and (3) the robot blade retracts. (4) The lift pins are retracted to place the wafer onto a pedestal. (5) The lift pins are retracted back below the pedestal, and (6) the pedestal is raised for substrate processing. (7) Once substrate processing is complete, the pedestal is retracted to a wafer release position. (8) The lift pins are then raised to the wafer release position to pick up the wafer from the pedestal. (9) The lift pins are then raised to handoff the wafer to the indexer blade, and (10) the indexer blade receives the wafer and the lift pins are retracted.

(11) The indexer blade rotates, and (12) the lift pins are raised to pick up a new wafer from the indexer blade. (13) The indexer blade then rotates and moves out of the way of lift pins. (14) The lift pins are retracted to place the wafer on the pedestal. (15) Operations (6)-(14) are then repeated until the process is completed. (16) After completion of the process, operation (14) is avoided in the loop, and the lift pins from operations (12), (13) are raised to handoff the wafer to the robot blade.

In this example, the indexer and robot blade move in the horizontal directions, though other directions are contemplated. In addition, a simplified sequence can include operations (1)-(8) and (16). At, e.g., operations (2), (4), (8), (10), (12), (14), (15), and (16), the current and/or torque can be monitored and measured to determine whether wafer handoff is abnormal. One or more operations in the wafer transfer sequence can be performed by one or more processors, such as the PLC.

Figure 3:
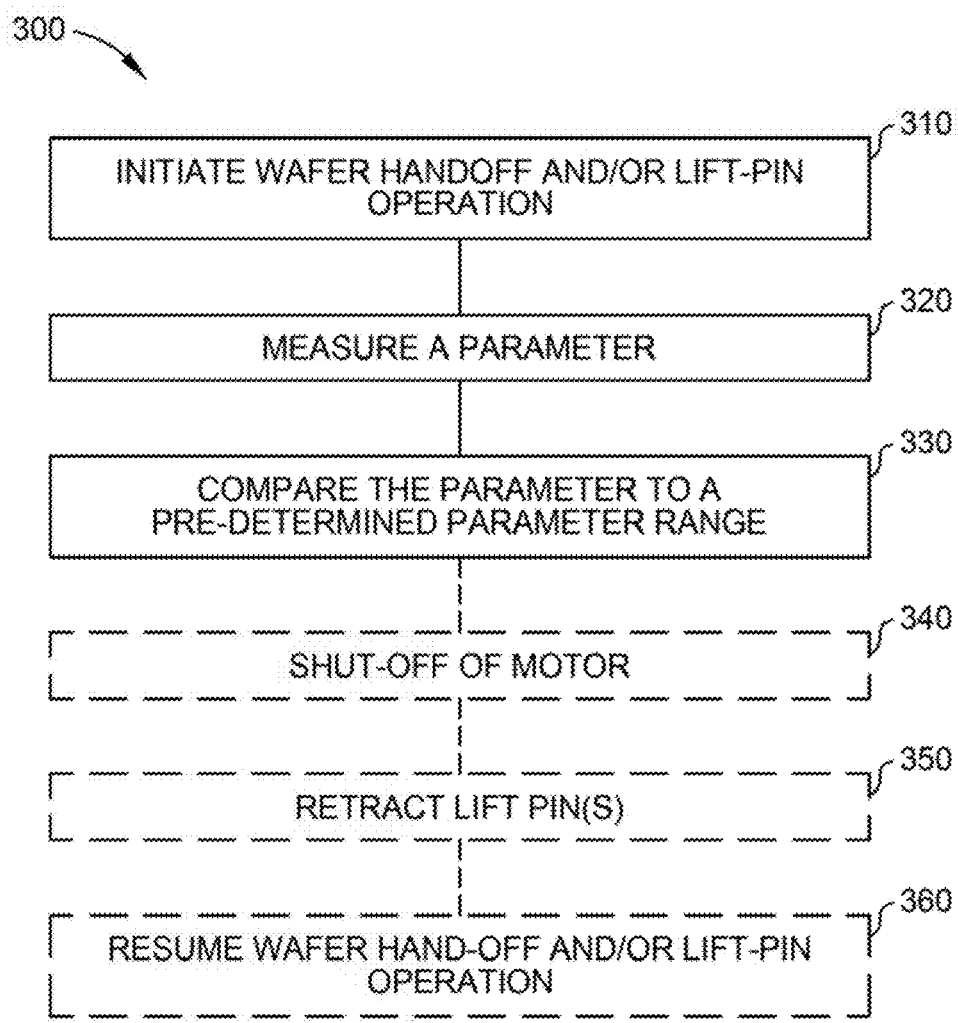
FIG. 3 shows example operations of a method of wafer detection according to at least one embodiment of the present disclosure.

FIG. 3 shows example operations of a method 300 of wafer detection according to at least one embodiment of the present disclosure. Method 300 can be utilized to detect, e.g., imperfect wafer handoff (wafer transfer) due to, e.g., residual chucking, extra load applied on the wafer by the lift pin drive, among other abnormalities. Because abnormalities in, e.g., wafer transfer, lift pin position, and/or wafer position are detected, transfer processes and/or other processes can be ceased prior to wafer damage, enabling closed-loop control.

Method 300 begins with the PLC, e.g., PLC 125, initiating a wafer handoff/transfer operation (and/or lift pin operation) at operation 310. The wafer transfer operation can include causing wafer transfer between components (e.g., lift pins, pedestal, an indexer (or blade thereof), a robot (or blade thereof), or a combination thereof) of a semiconductor processing system. The components can be controlled by the PLC. The wafer transfer sequence can include wafer lift-pin movement (which may also be initiated by the PLC). Here, the wafer lift pins are raised (or lowered)—by, e.g., the movement of the shaft, hoop ring, and motor drive assembly—to a position to lift the wafer from a robot blade, to lift the wafer off a pedestal, or lift the wafer from a robot or indexer blade. For example, the lift pin(s) can be moved to the wafer transfer plane. The wafer transfer plane is the plane at a fixed height where wafer handoff occurs between a robot blade and the lift pins. As another example, the lift pins can be retracted (or raised) to position the wafer onto the pedestal. As another example, the lift pins can be raised (or retracted) to a position where the indexer can grab the wafer. Other examples are described above in the example wafer transfer sequence. In these and other examples, the load can be detected to determine whether additional load (e.g., from incomplete dechucking from the pedestal) is encountered.

At operation 320, a parameter ((e.g., a current driving the motor (e.g., motor 115), a torque applied to the motor drive assembly, or a combination thereof) is measured and/or monitored. In some embodiments, one or more processors can be configured to measure the parameter, convert the parameter to a signal, transmit a signal, and/or receive a signal from a sensor that is measuring the parameter. In some examples, the sensor can include a processor to transmit the signal to the PLC. Operation 320 can include various sub-operations. These sub-operations can include the PLC triggering a drive current measurement (read) operation based on the scan zone of the lift pin position. The scan zone is, e.g., a lift pin position window in which current (and/or torque) is monitored. Measuring and/or monitoring the current and/or torque in operation 320 can further include plotting a graph of current versus lift pin position, torque versus lift pin position, or both.

Another sub-operation of operation 320 can include determining a derivative of current versus lift pin position ($dI_a/dx$) for each lift pin position window. Here, $dI_a/dx$ can be plotted for each of the lift pin position windows. For example, $dI_a$ per 10 μm of wafer movement (raising and lowering) is determined and can then be plotted. Additionally, or alternatively, another sub-operation of operation 320 can include determining a derivative of torque versus lift pin position (dT/dx) for each lift pin position window. Here, dT/dx can be plotted for each of the lift pin position windows. For example, dT per 10 μm of wafer movement (raising and lowering) is determined and can then be plotted. The plot(s) can be represented by the example shown in FIG. 2B. For any wafer handoff where lift pins are involved, embodiments described herein enable monitoring and measuring of current/torque versus lift position to determine whether wafer handoff is abnormal. Examples of wafer handoff include, but are not limited to, handoff between the pedestal and lift pins, handoff between lift pins and an indexer, and handoff between lift pin and robot blade.

At operation 330, the sample data (e.g., the data from operation 320) is compared with a pre-defined data range (e.g., range of current and/or range of torque) based on normal operation data. The normal operation data can be reference data collected for normal (or proper) wafer transfer, such as that shown in FIG. 2A. The normal operation data can be a data set stored in the PLC. In some embodiments, and for determining whether the wafer-lifting operation is normal, the reference data is set to current and/or torque depending on, e.g., the nature of plot. Thus, the comparison performed in operation 330 indicates, e.g., wafer break and/or slide off.

If the sample data is determined to be within the pre-defined range (indicating normal operation) the wafer transfer sequence/lift-pin operation can continue. If the sample data is determined to be outside the pre-defined range (indicating, e.g., wafer breakage or abrupt wafer release), the PLC triggers shut-off of the motor (e.g., motor 115 and/or other components) at operation 340. Here, a shut-off command (e.g., software to control all slave hardware together at the same time) can be sent from PLC 125 to the motor driver (e.g., motor driver 120) to shut off the motor 115. Because the motor controls the lift pin position, shut-off of the motor stops movement of the lift pin. At operation 350, the lift pin(s) can then be retracted by the PLC 125 commanding motor driver 120 to cause the motor 115 to retract the lift pin(s). Retraction of the lift pin(s) serves to, e.g., avoid breaking the wafer. For example, if the lift pin is not stopped or retracted, then the motor applies additional load on the wafer. The additional force can break the wafer in partially chucked conditions.

At operation 360, the wafer transfer and/or lift-pin operation can be resumed. Here, one or more of operations 310-350 can be repeated, such as operations 310-330. If data indicating that, e.g., wafer breakage or abrupt wafer release (as determined at operation 330), is observed again, the processing chamber can be opened for inspection. For example, the chamber can be opened to inspect whether the wafer, in fact, broke or slipped off. If data indicates no abnormality (or no abnormality outside of a certain deviation), the wafer transfer sequence/lift-pin operation continues.

Example Chamber

Figure 4A:
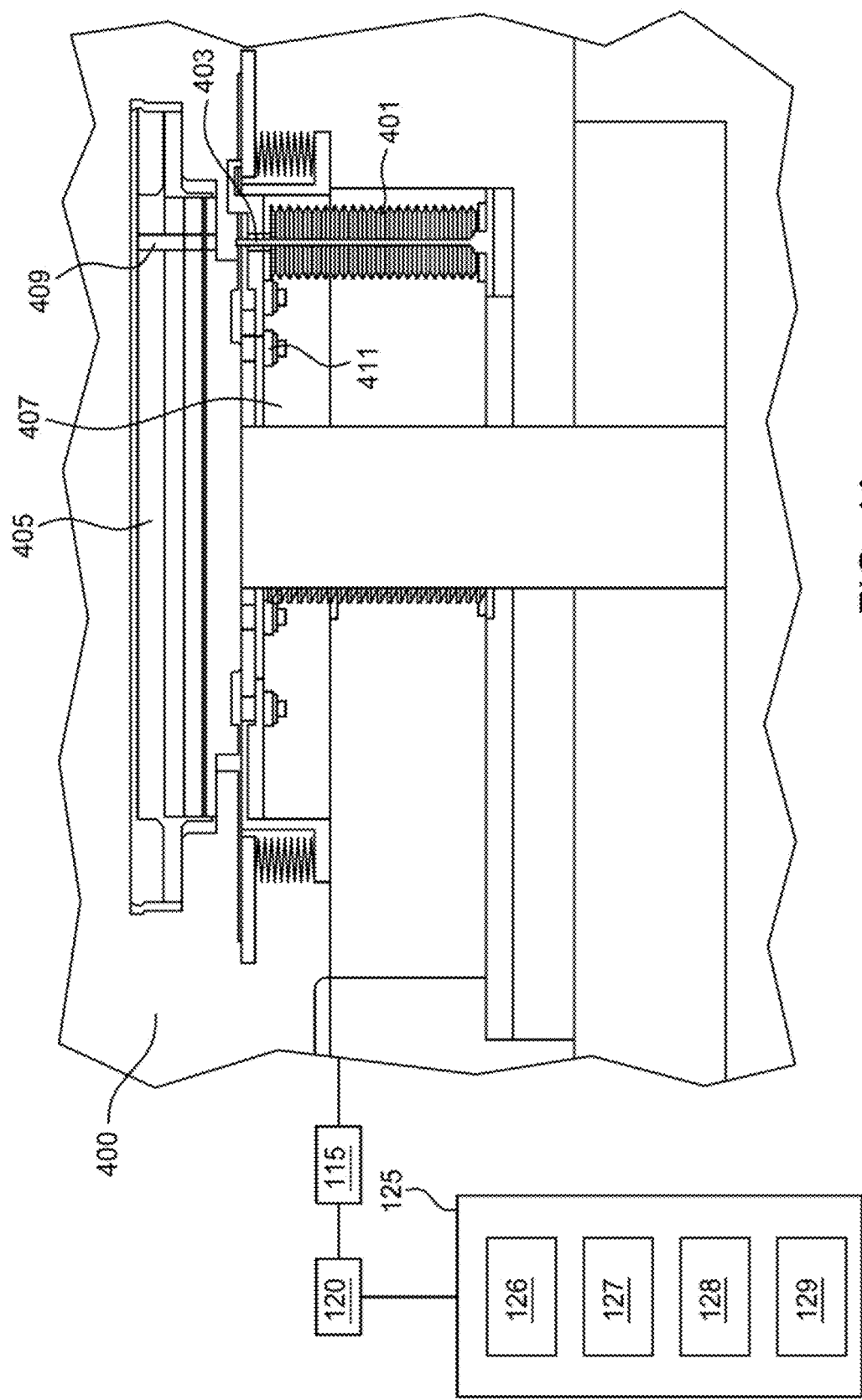
FIG. 4A is an example chamber that can be utilized with embodiments described herein.
Figure 4B:
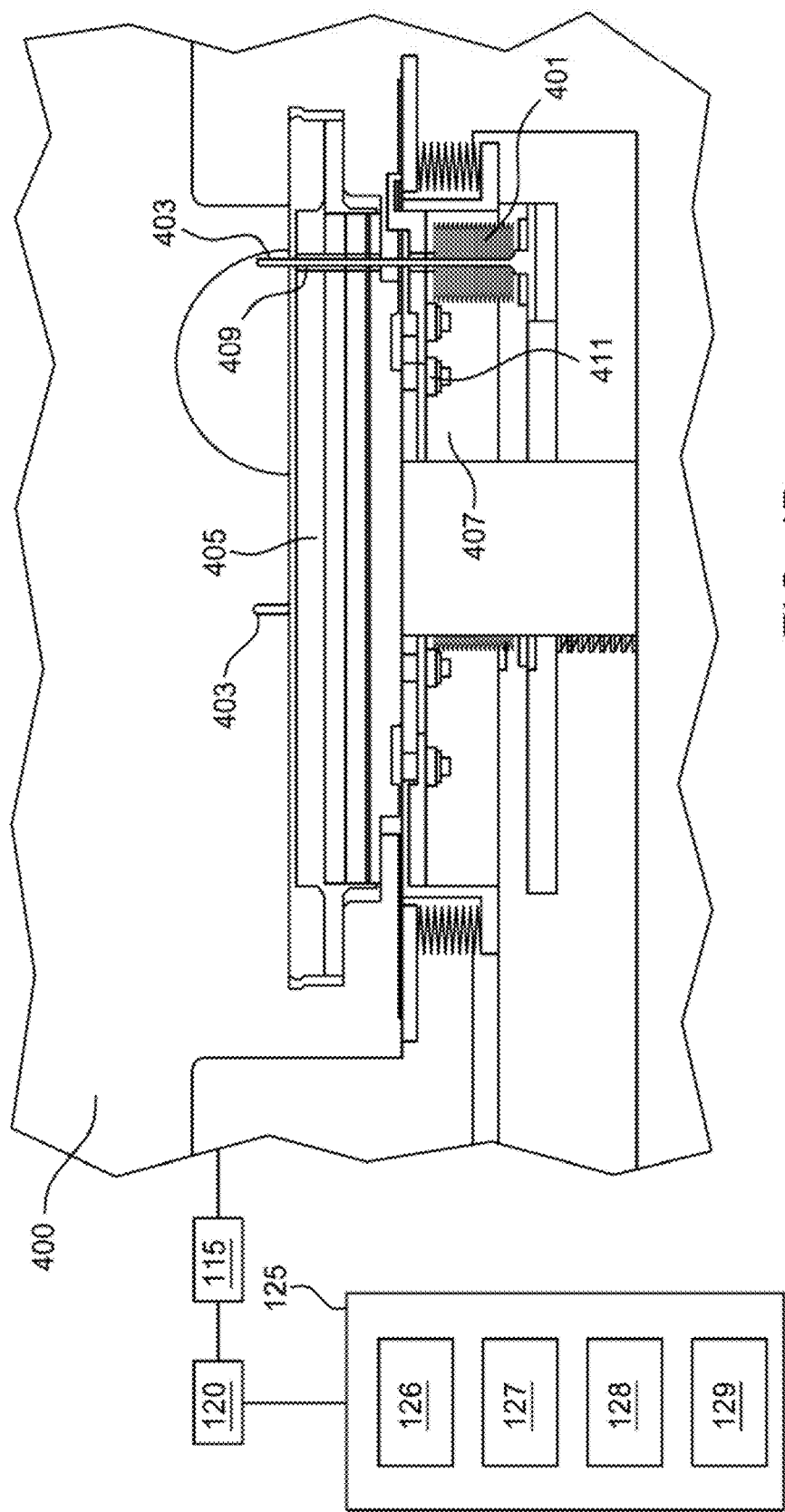
FIG. 4B is an example chamber that can be utilized with embodiments described herein.

FIGS. 4A and 4B show an illustrative, but non-limiting, example chamber 400 that can be used with embodiments described herein. As shown in FIGS. 4A and 4B, a pedestal 405, as well as other chamber component(s), is in different positions for wafer transfer. Other chambers (having different or additional components) are contemplated. For example, although bellow(s) are utilized in the example chamber described herein, it is contemplated that the chamber can be free of bellow(s).

The pedestal 405 is positioned above bellow(s) 401 (e.g., a vacuum separation bellow). The pedestal 405 has a plurality of openings 409 through which one or more lift pin(s) 403 can move up and down for wafer movement/transfer. Bolts/screws 411 couple a flange 407 to pedestal 405. One or more surfaces of flange 407 contact one or more surfaces of bellow(s) 401. The bellow(s) 401 expands and contracts via movement of, e.g., pedestal 405.

The motor driver 120, which is controlled by the PLC 125, is utilized to detect the current. The PLC 125 includes the controller 126. The controller 126 includes the central processing unit (CPU) 127, the memory 128, and support circuits 129 for the CPU 127. Motor driver 120, PLC 125, controller 126, CPU 127, memory 128, and support circuits 129 are discussed above.

During processing, and as shown in FIG. 4A, the bellow(s) 401 are in an expanded state and the lift pin(s) 403 are retracted below a top surface of pedestal 405. FIG. 4B shows the position for wafer transfer between lift pin(s) 403 and a robot blade (not shown). During wafer/shutter transfer, and as shown in FIG. 4B, a portion of the lift pin(s) 403 are located above pedestal 405. The bellow(s) 401 will be compressed as the motor (not shown), which is controlled by motor driver 120, drives the lift pin(s) 403—via all the components that raise the lift pin(s)—upward to pick up a wafer (not shown). The bellow(s) 401, having a spring rate (k), are compressed linearly based on the position of the lift pin(s) 403. Operation increases the load on the motor (e.g., motor 115) linearly as a function of k×y, where k is the spring rate and y is the compression of bellow(s) 401.

In the case of electrostatic chucks, residual charge left in the wafer, the pedestal, e.g., pedestal 405, and/or other chamber components (e.g., lift pin(s) 403) can cause residual chucking forces to exist. As discussed above, these residual chucking forces can lead to wafer damage/breakage. Typically, the residual charges dissipate after about 2-3 seconds, though charge dissipation varies based on conditions such as temperature and pressure. In typical operations, the lift pin(s) (e.g., lift pin(s) 403) are moved once the charge has dissipated. Detected spikes in torque (or current) of the motor, e.g., motor 115, can be correlated to residual chucking forces that can cause wafer breakage, enabling detection by the motor driver 120 and/or the PLC 125. Accordingly, embodiments described herein allow for early detection of wafer transfer issues and/or wafer abnormalities.

Any of the operations described above, such as one or more operations of method 300 may be included as instructions in a computer-readable medium for execution by a control unit (e.g., controller 126) or any other processing system. The computer-readable medium may comprise any suitable memory for storing instructions, such as read-only memory (ROM), random access memory (RAM), flash memory, an electrically erasable programmable ROM (EEPROM), a compact disc ROM (CD-ROM), a floppy disk, and the like.

Embodiments described herein provide for methods and apparatus for detecting and/or monitoring, e.g., abnormalities in wafer transfer handling. Embodiments described herein enable early detection of wafer breakage and prevention (or mitigation) of wafer breakage or other abnormalities during, e.g., wafer transfer. As a result, higher wafer throughput and decreased fab downtime can be realized. Moreover, lower production costs are achieved by using an apparatus and method that is free of conventional sensors and a lower incidence of wafer breakage.

In the foregoing, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the foregoing aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

As used herein, the indefinite article "a" or "an" shall mean "at least one" unless specified to the contrary or the context clearly indicates otherwise.

While the foregoing is directed to embodiments of the present disclosure, other and further embodiments of the disclosure may be devised without departing from the basic scope thereof, and the scope thereof is determined by the claims that follow.

What is claimed is:

1. A non-transitory computer-readable medium storing instructions that, when executed on a processor, perform operations for wafer dechucking, the operations comprising:
    initiating a wafer transfer operation to transfer a wafer between components of a semiconductor processing system, the semiconductor processing system comprising a programmable logic controller (PLC) coupled to a motor driver, the motor driver coupled to a motor, the motor coupled to a lift pin, the motor configured to adjust a height of the lift pin above a pedestal, the lift pin configured to raise and lower the wafer;
    analyzing a force applied to the lift pin by a torque supplied by the motor by comparing
    a first current supplied to the motor as determined by the motor driver with a first pre-determined current range, the first pre-determined current range being stored in the PLC, wherein:
    the PLC and the motor driver are in electrical communication via a PLC-to-motor driver circuitry,
    the motor driver supplies a first signal to the PLC via the PLC-to-motor driver circuitry, the first signal corresponding to the first current supplied to the motor, the first current is proportional to the torque supplied by the motor,
    the PLC analyzes the first signal supplied by the motor driver by comparing the first current to the first pre-determined current range and additionally determining a derivative of the first current supplied to the motor versus a wafer position; and
    changing the force applied to the lift pin based on both the comparison of the first current and the first pre-determined current range and a comparison of the derivative to a pre-defined data range, wherein the PLC supplies a second signal to the motor driver via the PLC-to-motor driver circuitry based on a result of the comparisons, the second signal corresponding to an instruction to either increase or decrease the force applied to the lift pin, and
    wherein when the derivative is outside the pre-defined data range, the PLC causes the motor to stop.

2. The non-transitory computer-readable medium of claim 1, wherein:
    the first current is measured at a first wafer position above the pedestal.

3. The non-transitory computer-readable medium of claim 1, wherein after the motor is caused to stop, the operations further comprise:
    causing the motor to restart; and
    lowering the lift pin.

4. The non-transitory computer-readable medium of claim 1, wherein, when the first current is inside the first pre-determined current range, the operations further comprise:
    measuring a second current supplied to the motor as determined by the motor driver and comparing the second current with a second pre-determined current range, the second pre-determined current range being stored in the PLC.

5. A non-transitory computer-readable medium storing instructions that, when executed on a processor, perform a method for wafer dechucking, the method comprising:
    initiating a wafer transfer operation to transfer a wafer between components of a semiconductor processing system, the semiconductor processing system comprising a programmable logic controller (PLC) coupled to a motor driver, the motor driver coupled to a motor, the motor coupled to a lift pin, the motor configured to adjust a height of the lift pin above a pedestal, the lift pin configured to raise and lower the wafer;
    analyzing a force applied to the lift pin by a torque supplied by the motor by measuring a first current supplied to the motor during the wafer transfer operation, the first current being detected by the motor driver, wherein the first current is proportional to the torque supplied by the motor;
    supplying a first signal from the motor driver to the PLC via a PLC-to-motor driver circuitry, the first signal corresponding to the first current supplied to the motor;
    analyzing the first signal by comparing the first current supplied to the motor to a first pre-determined current range and additionally determining a derivative of the first current supplied to the motor versus a wafer position, the first pre-determined current range being stored in the PLC;
    supplying a second signal from the PLC to the motor driver via the PLC-to-motor driver circuitry, the second signal corresponding to an instruction to either increase or decrease the force applied to the lift pin; and
    changing the force applied to the lift pin by the torque supplied by the motor based on the first current supplied to the motor and a comparison of the derivative to a pre-defined data range,
    wherein the derivative is outside of the pre-defined data range, the PLC causes the motor to stop.

6. The non-transitory computer-readable medium of claim 5, wherein:
    the first current supplied to the motor is measured at a first wafer position.

7. The non-transitory computer-readable medium of claim 5, wherein after the motor is caused to stop, the method further comprises:
    causing the motor to restart; and
    lowering the lift pin.

8. The non-transitory computer-readable medium of claim 5, wherein, when the first current supplied to the motor is inside the first pre-determined current range, the method further comprises:
    measuring a second current supplied to the motor, the second current being detected by the motor driver; and
    determining a difference between the second current and a second pre-determined current range, the second pre-determined current range being stored in the PLC.

* * * * *